(12) United States Patent
Seo et al.

(10) Patent No.: US 11,531,585 B2
(45) Date of Patent: Dec. 20, 2022

(54) MEMORY MODULE AND OPERATING METHOD

(71) Applicant: SAMSUNG ELECTRONICS CO., LTD., Suwon-si (KR)

(72) Inventors: Deok Ho Seo, Suwon-si (KR); Nam Hyung Kim, Seoul (KR); Dae-Jeong Kim, Seoul (KR); Do-Han Kim, Hwaseong-si (KR); Min Su Kim, Seongnam-si (KR); Won Jae Shin, Seoul (KR); Yong Jun Yu, Suwon-si (KR); Chang Min Lee, Hwaseong-si (KR); Il Gyu Jung, Hwaseong-si (KR); In Su Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/177,415

(22) Filed: Feb. 17, 2021

(65) Prior Publication Data
US 2021/0373996 A1 Dec. 2, 2021

(30) Foreign Application Priority Data
Jun. 2, 2020 (KR) ........................ 10-2020-0066493

(51) Int. Cl.
*G06F 11/10* (2006.01)
*G11C 29/42* (2006.01)
(Continued)

(52) U.S. Cl.
CPC ...... *G06F 11/1068* (2013.01); *G06F 11/1048* (2013.01); *G11C 11/406* (2013.01);
(Continued)

(58) Field of Classification Search
CPC ............ G06F 11/1068; G06F 11/1048; G11C 11/406; G11C 11/40603; G11C 11/40611; G11C 29/10; G11C 29/42; G11C 29/52
(Continued)

(56) References Cited

U.S. PATENT DOCUMENTS 6,182,248 B1 * 1/2001 Armstrong ............ G06F 11/221
714/757
7,124,347 B2 10/2006 Plants
(Continued)

FOREIGN PATENT DOCUMENTS

CN 104731668 6/2015
KR 10-1810822 12/2017

OTHER PUBLICATIONS

Cai et al., Flash Correct-and-Refresh: Retention-Aware Error Management for Increased Flash Memory Lifetime, 2012, IEEE, pp. 94-101. (Year: 2012).*

*Primary Examiner* — John J Tabone, Jr.
(74) *Attorney, Agent, or Firm* — F. Chau & Associates, LLC (57) ABSTRACT

A memory module includes a memory device configured to receive a first refresh command from a host, and perform a refresh operation in response to the first refresh command during a refresh time, and a computing unit configured to detect the first refresh command provided from the host to the memory device, and write a first error pattern at a first address of the memory device during the refresh time.

20 Claims, 11 Drawing Sheets

(51) Int. Cl.
*G11C 29/52* (2006.01)
*G11C 11/406* (2006.01)
*G11C 29/10* (2006.01)

(52) U.S. Cl.
CPC ... *G11C 11/40603* (2013.01); *G11C 11/40611* (2013.01); *G11C 29/10* (2013.01); *G11C 29/42* (2013.01); *G11C 29/52* (2013.01)

(58) Field of Classification Search
USPC .............. 714/764, 763, 766, 798, 773, 799; 365/200, 201, 222
See application file for complete search history.

(56) References Cited

U.S. PATENT DOCUMENTS

| | | | |
|---|---|---|---|
| 8,181,100 B1 | 5/2012 | Purdham et al. | |
| 8,572,529 B2 | 10/2013 | Zawalski et al. | |
| 8,954,806 B2 | 2/2015 | Dan et al. | |
| 9,159,458 B2 | 10/2015 | Griffin et al. | |
| 9,405,646 B2 | 8/2016 | Yigzaw et al. | |
| 9,990,251 B2 * | 6/2018 | Kim | G11C 29/18 |
| 10,910,082 B1 * | 2/2021 | Becker | G06F 11/1048 |
| 11,372,677 B1 * | 6/2022 | Geva | G06F 9/383 |
| 2005/0169083 A1 * | 8/2005 | Riho | G11C 11/4096 365/222 |
| 2007/0079218 A1 * | 4/2007 | Nagai | G06F 11/106 714/763 |
| 2009/0044076 A1 * | 2/2009 | Sugahara | G06F 11/1068 714/764 |
| 2011/0179311 A1 * | 7/2011 | Nachimuthu | G06F 11/3676 714/E11.144 |
| 2013/0111296 A1 * | 5/2013 | Jung | G06F 11/1048 714/755 |
| 2013/0139008 A1 | 5/2013 | Kalyanasundharam et al. | |
| 2013/0151930 A1 * | 6/2013 | Yigzaw | G06F 11/2236 714/768 |
| 2015/0074473 A1 * | 3/2015 | Unesaki | G06F 11/2215 714/703 |
| 2016/0026524 A1 * | 1/2016 | Hoya | G11C 7/06 714/764 |
| 2018/0174665 A1 * | 6/2018 | Kraipak | G11C 29/36 |
| 2019/0013085 A1 * | 1/2019 | Benedict | G11C 29/42 |
| 2019/0102271 A1 * | 4/2019 | Matsukawa | G06F 11/1048 |
| 2019/0130991 A1 * | 5/2019 | Son | G11C 29/42 |
| 2019/0188064 A1 * | 6/2019 | Ciraula | G11C 29/4401 |
| 2021/0272609 A1 * | 9/2021 | Noguchi | G11C 7/1051 |
| 2021/0373996 A1 * | 12/2021 | Seo | G06F 11/1068 |
| 2022/0147416 A1 * | 5/2022 | Murphy | G06F 11/1004 |
| 2022/0189537 A1 * | 6/2022 | Kim | G11C 11/40618 |

* cited by examiner

MEMORY MODULE AND OPERATING METHOD

CROSS-REFERENCE TO RELATED APPLICATIONS

This application claims priority under 35 U.S.C. § 119 to Korean Patent Application No. 10-2020-0066493, filed on Jun. 2, 2020 in the Korean Intellectual Property Office, the disclosure of which is incorporated by reference herein in its entirety.

TECHNICAL FIELD

Exemplary embodiments of the present disclosure relate to memory devices, and more particularly relate to a memory module with internal pattern injection and a method for operating the memory module.

DISCUSSION OF RELATED ART

A memory device performs a refresh operation to retain data stored in a memory cell. Since the refresh operation recharges the charge for the memory cell, power is consumed. In order to reduce the power consumption due to the refresh operation, the refresh operation may be executed differently depending on the temperature. On the other hand, since physical characteristics, arrangement positions, and the like may be different for each memory device, the memory devices may have temperatures different from each other.

SUMMARY

Embodiments of the present disclosure provide a memory module capable of injecting an error pattern into a memory device and automatically injecting all error patterns into the memory device, regardless of the operation of a host.

Embodiments of the present disclosure also provide a method for operating a memory module in which error patterns are injected and all the error patterns are automatically injected regardless of the operation of the host.

According to an exemplary embodiment of the present disclosure, a memory module includes a memory device which is configured to receive a first refresh command from a host, and perform a refresh operation in response to the first refresh command during a refresh time, and a computing unit configured to detect the first refresh command provided from the host to the memory device, and write a first error pattern at a first address of the memory device during the refresh time.

According to an exemplary embodiment of the present disclosure, a memory module includes a memory device configured to receive a first refresh command from a host, and perform a refresh operation in response to the first refresh command, a computing controller configured to detect the first refresh command provided to the memory device from the host, and read a first data stored at a first address of the memory device at a time point after a preset time elapses from a time point when the first refresh command is detected, a buffer in which the read first data is stored, and a computing unit including error pattern storage in which a plurality of error patterns is stored, wherein the computing controller is configured to read the first data stored at the first address of the memory device, and then write a first error pattern from among the plurality of error patterns at the first address.

According to an exemplary embodiment of the present disclosure, a method for operating a memory module includes refreshing a memory device in response to a first refresh command during a refresh time, storing in a buffer a first data stored at a first address of the memory device during the refresh time, and writing a first error pattern at the first address of the memory device, wherein the refresh time is longer than a first refresh time, which is a minimum time for the memory device to perform a refresh operation.

However, embodiments of the present disclosure are not restricted to those set forth herein. The above and other embodiments of the present disclosure will become more apparent to those of ordinary skill in the art to which the present disclosure pertains by referencing the detailed description of the present disclosure given below.

BRIEF DESCRIPTION OF THE DRAWINGS

The above and other embodiments of the present disclosure will become more apparent by describing in detail exemplary embodiments thereof with reference to the attached drawings, in which.

DETAILED DESCRIPTION

Figure 1:
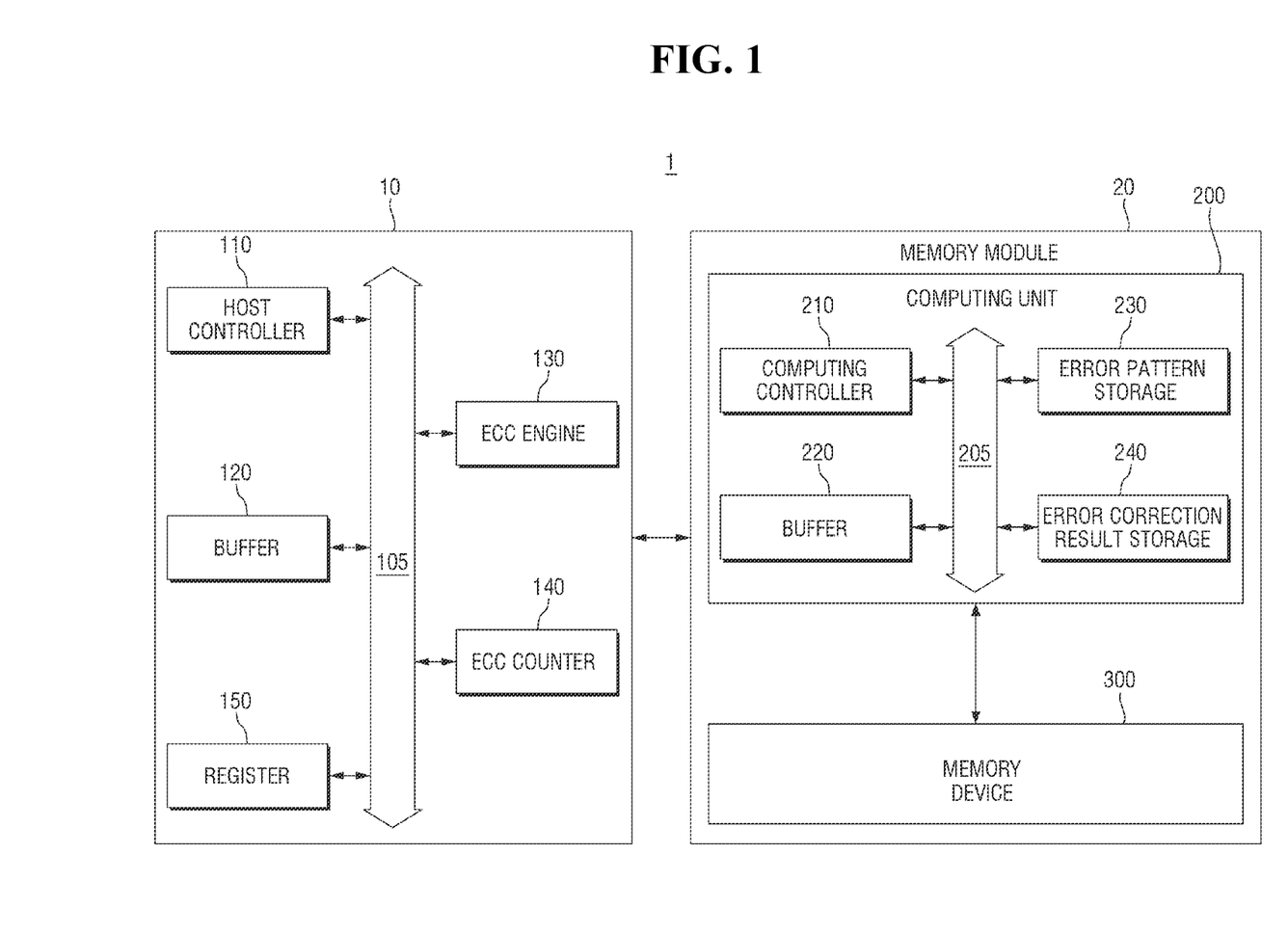
FIG. 1 is a block diagram for explaining a memory system according to an exemplary embodiment.

FIG. 1 is a block diagram for explaining a memory system according to an exemplary embodiment.

Referring to FIG. 1, a memory system 1 according to an exemplary embodiment of the present disclosure may include a host 10 and a memory module 20.

The host 10 may be connected to the memory module 20. The host 10 may write data in the memory module 20 or read data stored in the memory module 20. The host 10 may be, for example, a central processing unit (CPU) or an application processor (AP), without limitation thereto. The host 10 may include a host controller 110, a buffer 120, an Error Correcting/Correction Code (ECC) engine 130, an ECC counter 140 and a register 150. The host controller 110, the buffer 120, the ECC engine 130, the ECC counter 140 and the register 150 may be electrically connected to each other through a bus 105.

The memory module 20 may be, for example, a Dual In-line Memory Module (DIMM) type, without limitation thereto. The memory module 20 may include a computing unit 200 and a memory device 300. The computing unit 200 may include a computing controller 210, a buffer 220, an error pattern storage 230, and an error correction result storage 240. The computing controller 210, buffer 220, error pattern storage 230 and error correction result storage 240 may be electrically connected to each other through a bus 205.

The host controller 110 may drive an application or a driver. The application may be executed on the host 10 to control the memory system 1, and the driver may drive the memory module 20 electrically connected to the host 10. Specifically, the driver may receive from the application a command for controlling the memory module 20, and the memory module 20 may provide to the application a result obtained by processing the command.

The host controller 110 may provide an error injection command to the memory module 20. The error injection command may include a particular address and data. The particular address may be an address inside the memory device 300 into which the error is injected.

The host controller 110 may provide the error injection command to the memory module 20, and may change the refresh time of the memory device 300 stored in the register 150. The host controller 110 may change, for example, the refresh time of the memory device 300 from a first refresh time to a second refresh time. The host controller 110 may store the changed second refresh time in the register 150.

The first refresh time may be a minimum time for the memory device 300 to perform the refresh operation, and may be a predetermined value. The first refresh time may be a value determined depending on the capacity, structure, performance, and the like of the memory device 300.

The second refresh time may be a time taken by the memory device 300 to perform the refresh operation and by the computing unit 200 to perform the error injection operation in response to the error injection command. Therefore, the second refresh time may be longer than the first refresh time. That is, the memory module 20 may perform the error injection operation during the second refresh time.

The host 10 may provide an error injection stop command to the computing unit 200. In this case, the host controller 110 may change the refresh time of the memory device 300 from the second refresh time to the first refresh time. The host controller 110 may store the changed first refresh time in the register 150.

The host controller 110 may provide a refresh command to the memory device 300. The host controller 110 may provide a valid command (e.g., VALID of FIG. 6) such as read or write command, after the refresh time elapses from the time point when the refresh command is transmitted to the memory device 300.

The buffer 120 may be used as a main memory of the host 10, or may be used as a cache memory, a temporary memory, or the like for temporarily storing data. The buffer 120 may store a particular address and data included in the error injection command.

Although the buffer 120 may include, for example, a volatile memory such as a Dynamic Random-Access Memory (DRAM), the scope of the present disclosure is not limited thereto.

The ECC engine 130 may perform error detection and error correction operations. The ECC engine 130 may perform ECC encoding on the input data to generate parity data, and may perform ECC decoding on the data read from the memory device 300 to correct an error of the read data.

The ECC engine 130 may use a Parity-Check, a Cyclical Redundancy Code (CRC) Check, a Checksum Check and a Hamming code to detect and correct an error. In addition, the ECC engine 130 may use correction techniques, such as an ×4 Single Device Data Correction (SDDC), an ×8 Single-bit Error Correction and Double-bit Error Detection (SECDED), and a Lockstep ×8 SDDC to correct errors of the plurality of memory chips.

The ECC counter 140 may count the number of error corrections by the ECC engine 130.

The host 10 may provide a refresh command REF to the memory device 300. The host 10 may read the memory device 300 and perform an error correction operation at a time point after the refresh time elapses from a time point when the refresh command is provided to the memory device 300. The memory module 20 may include the computing unit 200 and the memory device 300.

The computing unit 200 may be connected between the host 10 and the memory device 300. The computing unit 200 may be directly connected to the memory device 300. The computing unit 200 may access the memory device 300 regardless of the host 10.

The computing unit 200 may communicate with the host 10 on the basis of, for example, Ethernet, I2C or serial communication, without limitation thereto.

The computing unit 200 may operate in accordance with a program which is input by a compatible unit, such as the application and/or driver of the host controller 110. The computing unit 200 may drive the memory device 300 in accordance with the input program. Although the computing unit 200 according to an exemplary embodiment of the present disclosure may be implemented by, for example, a field programmable gate array (FPGA), an FPGA Interface Manager (FIM) or a High Bandwidth Memory (HBM), the present disclosure is not limited thereto.

The computing unit 200 may include the computing controller 210, buffer 220, error pattern storage 230 and error correction result storage 240.

The computing controller 210 may control the overall operation of the computing unit 200. The computing controller 210 may detect a refresh command to be provided to the memory device 300 from the host 10.

The computing controller 210 may be provided with an error injection command from the host 10. The computing controller 210 may execute the error injection operation at a time point after a certain time elapses from a time point when the refresh command is detected in response to the error injection command. Here, the certain time may be a first refresh time.

The error injection operation may mean simulating an error in data stored at a particular address in the memory device 300 and determining an error correction result based on the error. The computing controller 210 may write one error pattern among a plurality of error patterns, which is stored in the error pattern storage 230, at a particular address included in the error injection command, and may determine the error correction result based on the error.

The buffer 220 may store a particular address and data included in the error injection command.

The error pattern storage 230 may store a plurality of error patterns. The plurality of error patterns may include a data pattern written at a particular address.

The error correction result storage 240 may store the error correction result based on the error pattern.

The memory device 300 may be connected to the host 10 and the computing unit 200. The memory device 300 may be accessed from the host 10 and/or the computing unit 200. The memory device 300 may store data or output the stored data in accordance with a control of the host 10.

The memory device 300 may communicate with the host 10 on the basis of, for example, a Double Data Rate (DDR) interface. Or, the memory device 300 may communicate with the host 10 on the basis of, for example, at least one of various interfaces such as a Universal Serial Bus (USB), a multimedia card (MMC), a peripheral component interconnection (PCI), a PCI-express (PCI-E), an Advanced Technology Attachment (ATA), a Serial-ATA (SATA), a Parallel-ATA (PATA), a small computer small interface (SCSI), an enhanced small disk interface (ESDI), an Integrated Drive Electronics (IDE), a Mobile Industry Processor interface (MIPI), a Nonvolatile Memory-express (NVM-e) and/or a Universal Flash Storage (UFS).

The memory device 300 may perform a refresh operation during a refresh time in response to a refresh command provided from the host 10. An error may be injected into the memory device 300 by the computing unit 200.

The memory device 300 according to an exemplary embodiment of the present disclosure may be a dynamic random access memory (DRAM) such as a Double Data Rate (DDR) Synchronous Dynamic Random Access Memory (SDRAM), a Low Power Double Data Rate (LPDDR) SDRAM, a Graphics Double Data Rate (GDDR) SDRAM, a Rambus Dynamic Random Access Memory (RDRAM) and/or an arbitrary memory device that utilizes a refresh operation.

Figure 2:
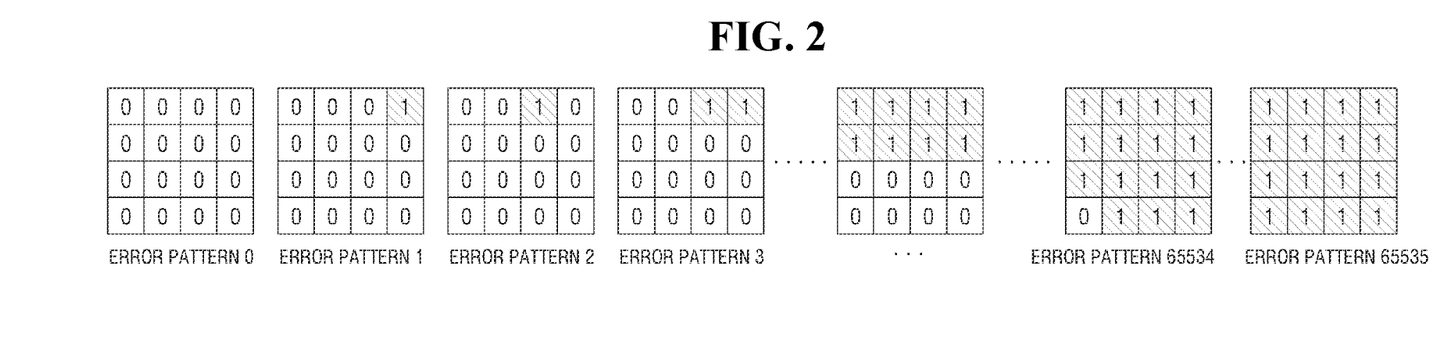
FIG. 2 is a data diagram for explaining an error pattern stored in an error pattern storage of FIG. 1.

FIG. 2 is a diagram for explaining an error pattern stored in the error pattern storage of FIG. 1. FIG. 2 shows an error pattern in a case where the memory device 300 is, for example, an ×4 DRAM chip.

Referring to FIG. 2, the error pattern may include a pattern in which data is stored in the ×4 DRAM chip. Since 1 bit may store 0 or 1, the ×4 DRAM chips may form a total of $2^{16}$ (=65,536) error patterns from all 0's to all 1's.

Figure 3:
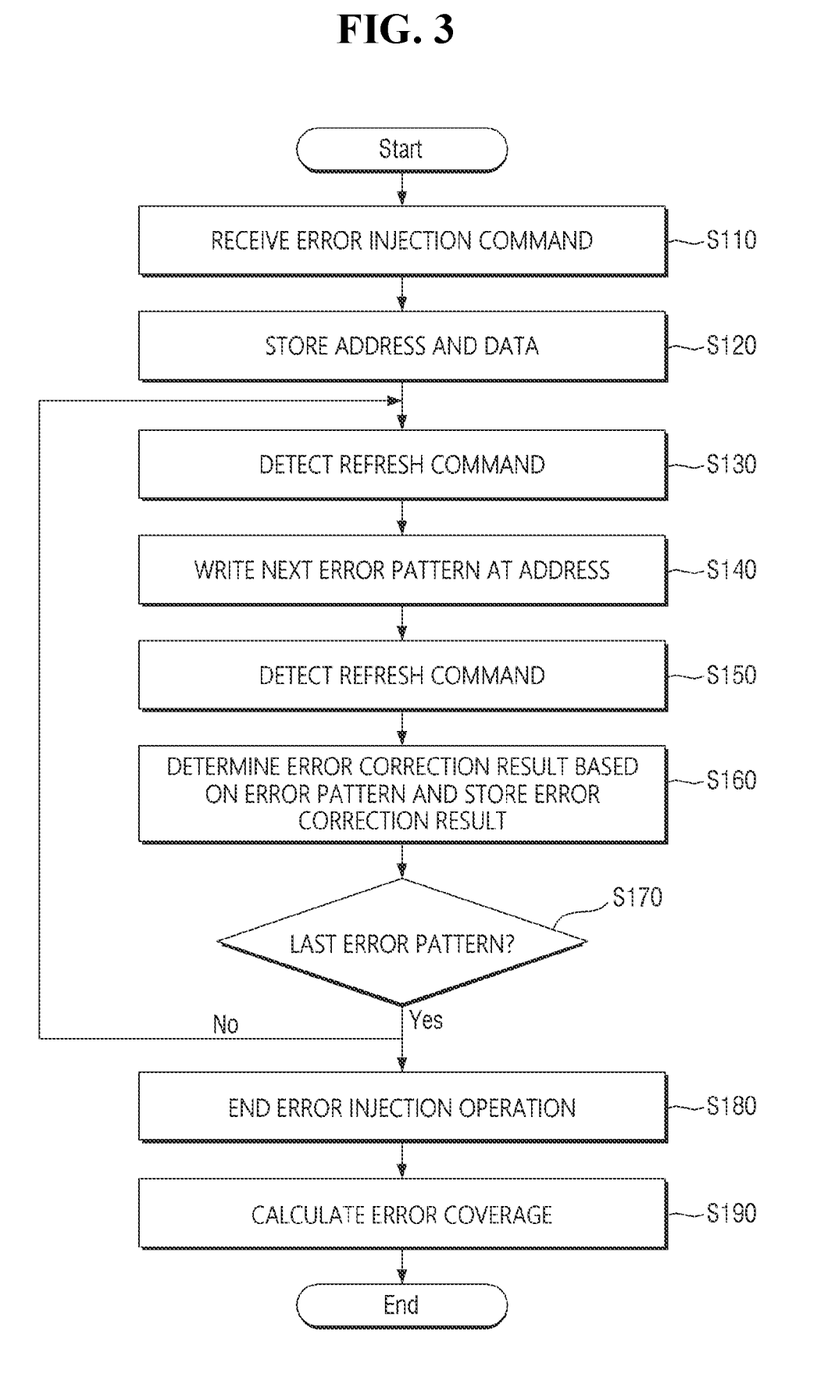
FIG. 3 is a flowchart diagram for explaining an operation of a computing unit according to an exemplary embodiment.

FIG. 3 is a flowchart for explaining the operation of a computing unit according to an exemplary embodiment.

Referring to FIGS. 1 and 3, the computing unit 200 may receive an error injection command from the host controller 110 at function block S110. The error injection command may include a particular address in the memory device 300 into which the error is to be injected, and data to be written at the particular address. The computing controller 210 may perform the error injection operation in response to the error injection command.

The computing controller 210 may store the particular address and data, which are included in the error injection command, in the buffer 220 at function block S120.

Subsequently, the computing controller 210 may detect the refresh command provided from the host 10 to the memory device 300 at function block S130.

The computing controller 210 may write an error pattern at a particular address in the memory device 300 included in the error injection command at a time point after a certain time elapses from the time point when the refresh command is detected at function block S140. The error pattern may be a next one of a plurality of error patterns stored in the error pattern storage 230. Here, the certain time may be a second refresh cycle.

Subsequently, the computing controller 210 may detect the refresh command to be provided from the host 10 to the memory device 300 at function block S150.

The computing controller 210 may determine the error correction result of the error pattern at a time point after a certain time elapses from the time point when the refresh command is detected, and may store the error correction result in the error correction result storage 240 at function block S160.

Subsequently, the computing controller 210 may determine whether the error pattern is the last error pattern stored in the error pattern storage 230 at decision block S170.

In block S170, when the error pattern is the last error pattern, the computing controller 210 may end the error injection operation at function block S180.

When the error injection operation is ended, the computing controller 210 may calculate error correction coverage at function block S190. The computing controller 210 may provide the error correction coverage to the host 10 in accordance with the command of the host 10.

On the other hand, in block S170, when the error pattern is not the last error pattern, the computing controller 210 may return to block S130. The computing controller 210 detects the refresh command at function block S130, and may write the next error pattern stored in the error pattern storage 230 at a particular address at a time point after a certain time elapses from the time point when the refresh command is detected. Here, the certain time may be the second refresh cycle as described above.

Figure 4:
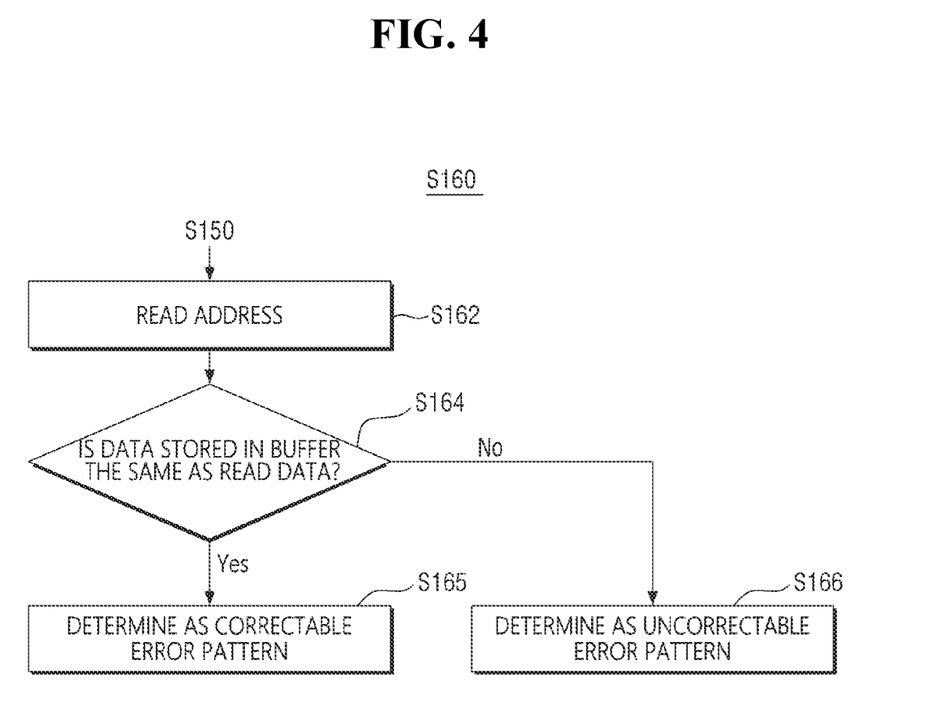
FIG. 4 is a flowchart diagram for explaining block S160 of FIG. 3.

FIG. 4 is a flowchart for explaining block S160 of FIG. 3.

Referring to FIG. 4, the computing controller 210 may read a particular address stored in the buffer 220 at a time point after a certain time elapses from the time point when the refresh command is detected at function block S162.

The computing controller 210 may compare the data read at a particular address in the memory device 300 with the data stored in the buffer 220 at decision block S164.

In block S164, when the data read from the particular address in the memory device 300 is the same as the data stored in the buffer 220, the computing controller 210 may determine the error pattern as a correctable error pattern, and may store the error correction result in the error correction result storage 240 at function block S165. In other words, when the data read at a particular address in the memory device 300 is the same as the data stored in the buffer 220, since it means that the error correction operation on the error pattern of the host 10 succeeds, the error pattern may be determined as a correctable error pattern.

On the other hand, in block S164, when the data read at the particular address in the memory device 300 is not the same as the data stored in the buffer 220, the computing controller 210 determines the error pattern as an uncorrectable error pattern, and may store the error correction result in the error correction result storage 240 at function block S166. That is, when the data read at a particular address in the memory device 300 is not the same as the data stored in the buffer 220, since it means that the error correction operation on the error pattern of the host 10 fails, the error pattern may be determined as an uncorrectable error pattern.

Figure 5:
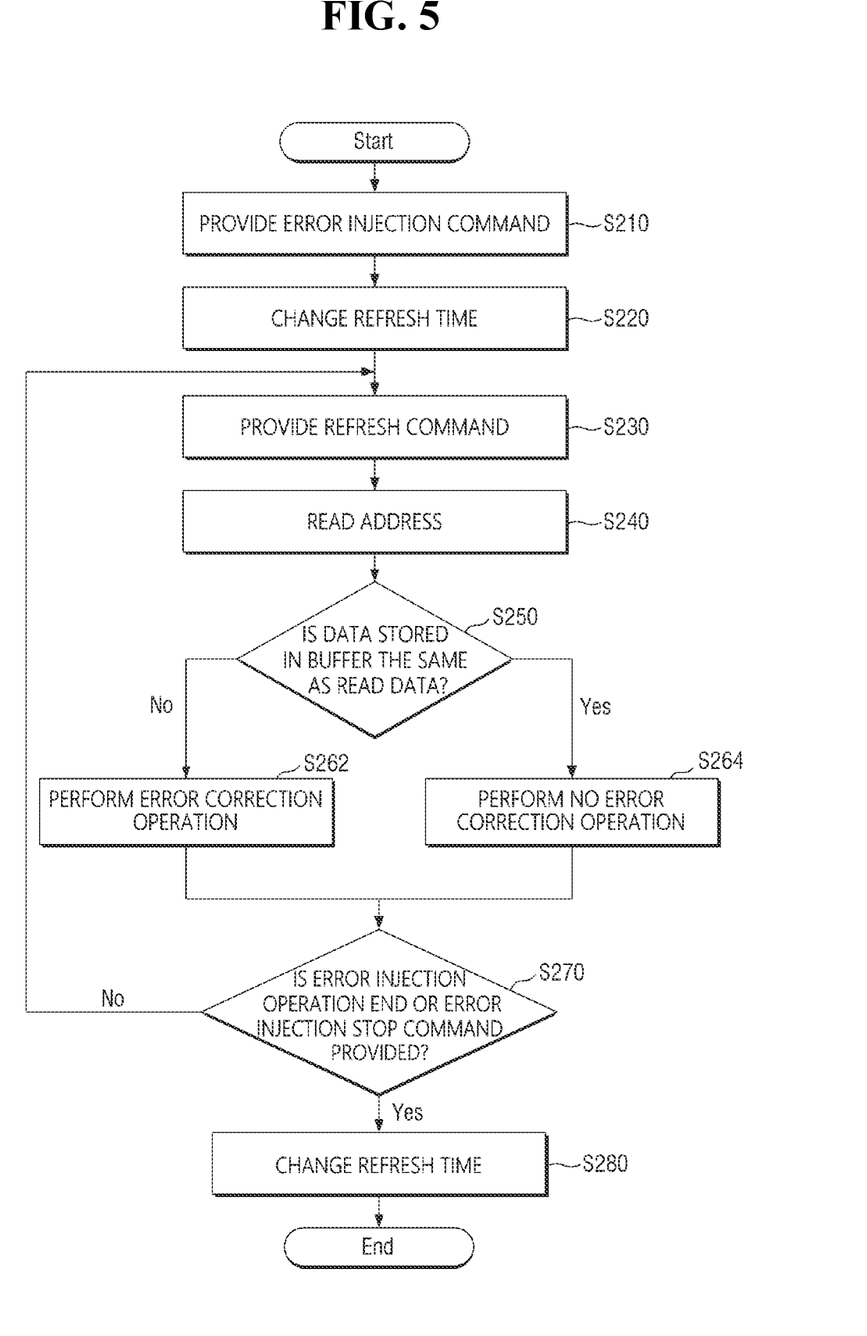
FIG. 5 is a flowchart diagram for explaining the operation of the host of FIG. 1.

FIG. 5 is a diagram for explaining the operation of the host 10 of FIG. 1.

Referring to FIGS. 1 and 5, the host controller 110 may provide an error injection command to the computing unit 200 at function block S210. The host controller 110 may store the particular address and data, which are included in the error injection command, in the buffer 120.

The host controller 110 may change the refresh time of the memory device 300 from the first refresh time to the second refresh time at function block S220.

The host controller 110 may provide a refresh command to the memory device 300 at function block S230.

The host controller 110 may read data from a particular address in the memory device 300 stored in the buffer 120, at a time point after the second refresh time elapses from the time point when the refresh command is provided to the memory device 300 at function block S240.

The host controller 110 may compare the data read from a particular address in the memory device 300 with the data stored in the buffer 120 at decision block S250.

In block S250, when the data read from the particular address in the memory device 300 is not the same as the data stored in the buffer 120, the ECC engine 130 may perform an error correction operation at function block S262. Accordingly, the host controller 110 may write the corrected data at a particular address in the memory device 300.

On the other hand, in block S250, when the data read from the particular address in the memory device 300 is the same as the data stored in the buffer 120, the ECC engine 130 need not perform any error correction operation at function block S264.

Subsequently, when the error injection operation of the computing unit 200 is ended, or when the host controller 110 provides the error injection stop command to the computing unit 200 at decision block S270, the host controller 110 may change the refresh time from the second refresh time to the first refresh time at function block S280.

On the other hand, when the error injection operation of the computing unit 200 is not ended or when the error injection stop command is not provided to the computing unit 200 at decision block S270, the host controller 110 returns to block S230, and may provide a refresh command to the memory device 300.

Figure 6:
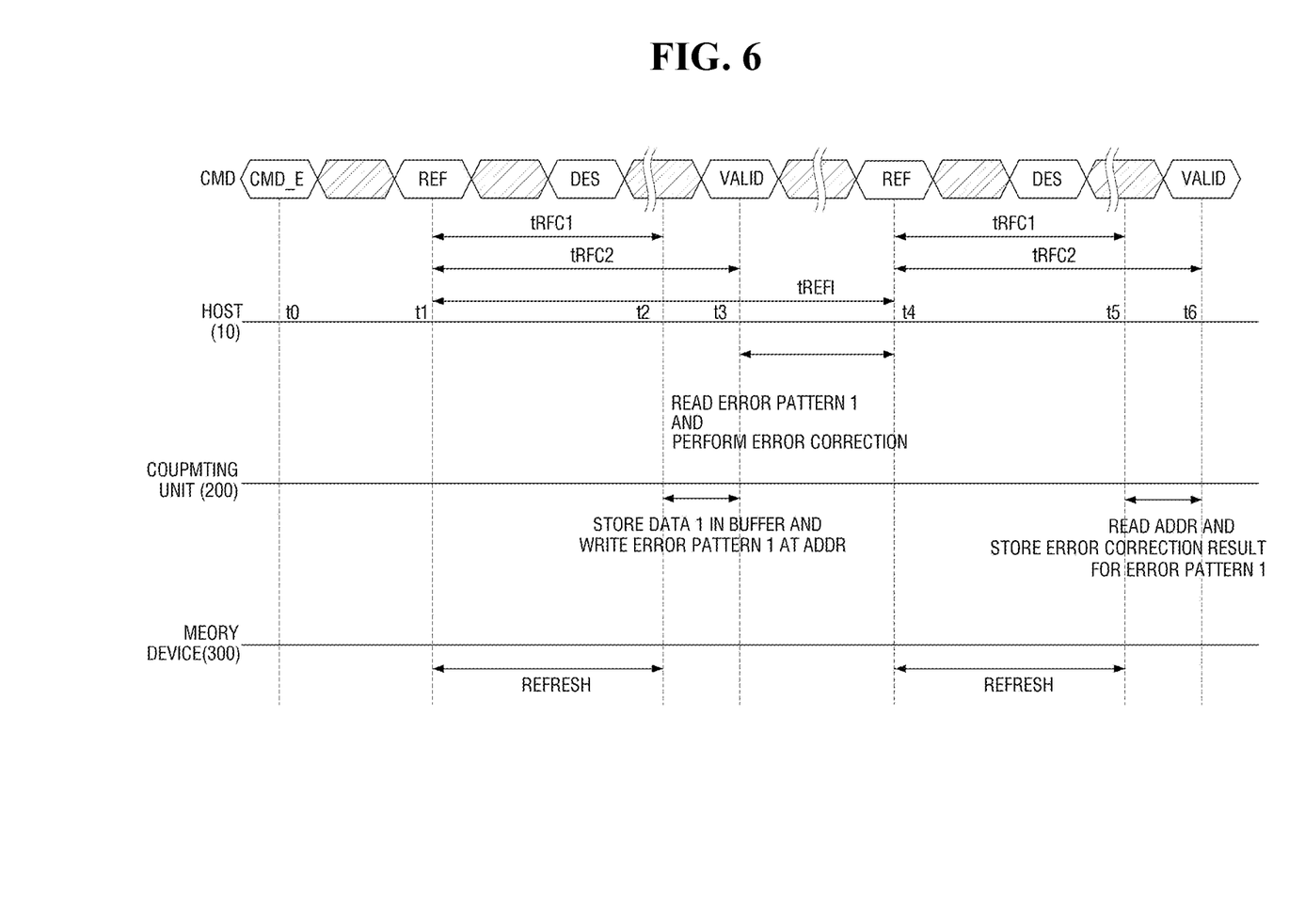
FIG. 6 is a timing diagram for explaining the operation of a memory system according to an exemplary embodiment.
Figure 7:
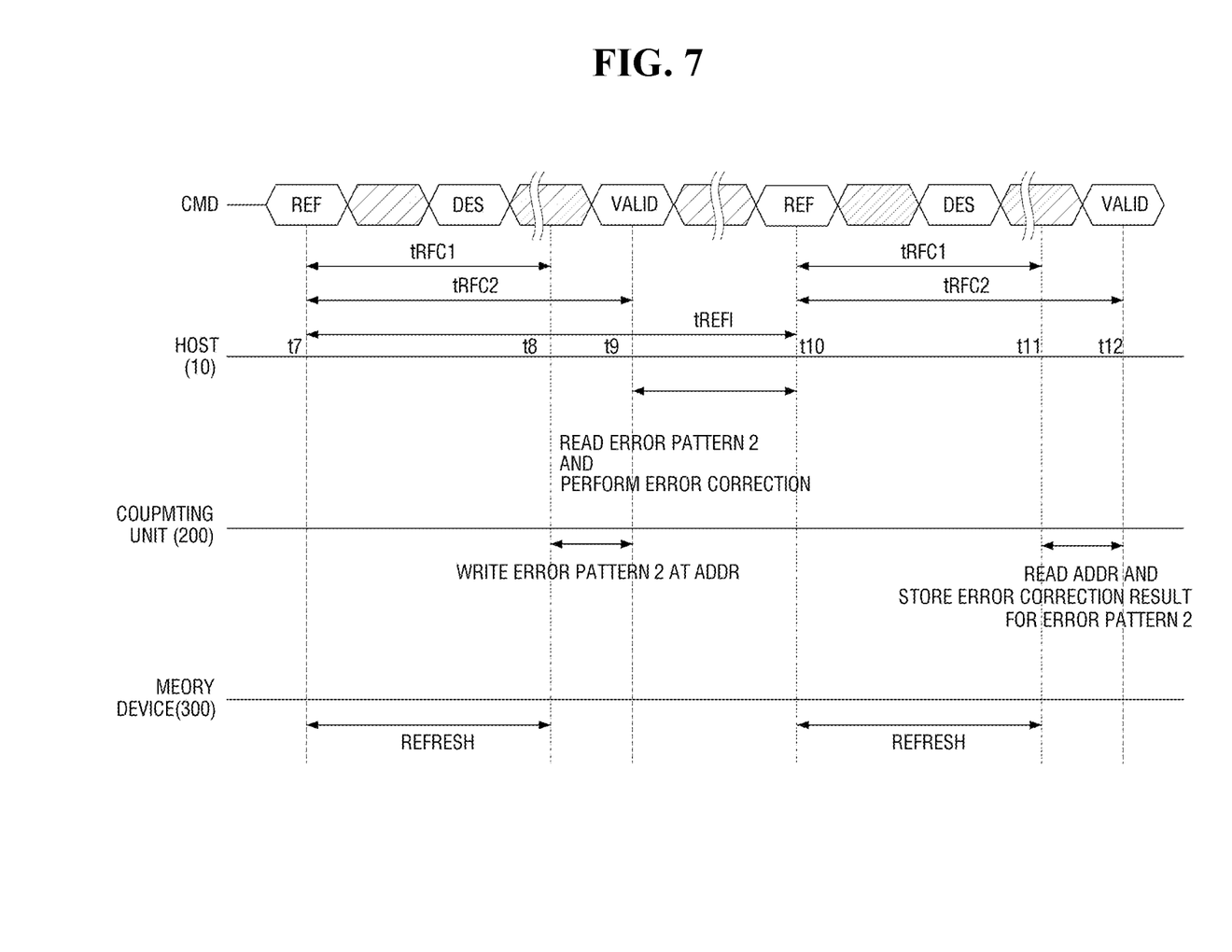
FIG. 7 is a timing diagram for explaining the operation of the memory system further to FIG. 6.

FIGS. 6 and 7 are timing diagrams for explaining the operation of the memory system according to an exemplary embodiment.

Referring to FIGS. 6 and 7, at a time point t0, the host 10 may provide an error injection command CMD_E to the computing unit 200. The host 10 may change the refresh time of the memory device 300 from a first refresh time tRFC1 to a second refresh time tRFC2. The host 10 may store address ADDR and first data DATA 1, which are included in the error injection command CMD_E, in a buffer in the host 10. The computing unit 200 may execute an error injection operation in response to the error injection command CMD_E.

At the time point t1, the host 10 may provide the first refresh command REF to the memory device 300. The host 10 does not provide commands related to the active operation to the memory device 300 for a second refresh time tRFC2.

The memory device 300 may perform the refresh operation in response to the refresh command REF. The memory device 300 may perform a refresh operation for the first refresh time tRFC1.

Further, the computing unit 200 may detect the refresh command REF provided from the host 10 to the memory device 300 at the time point t1.

At a time point t2 after the first refresh time tRFC1 elapses from the time point t1 when the refresh command REF is detected, the computing unit 200 may store the address ADDR and the first data DATA 1, which are included in the error injection command CMD_E, in the buffer 220.

Subsequently, the computing unit 200 may write a first error pattern, such as ERROR PATTERN 1, from among the plurality of error patterns stored in the error pattern storage 230, at the address ADDR of the memory device 300. Therefore, the operation of injecting an error pattern into the memory device 300 need not conflict with the commands associated with the active operation performed by the host 10.

The host 10 may read the memory device 300 at a time point t3 after the second refresh time tRFC2 elapses from the time point t1 when the refresh command REF is provided.

The host 10 may read the address ADDR stored in the buffer 120 of the host 10. Since the computing unit 200 writes the first error pattern ERROR PATTERN 1 at the address ADDR for the second refresh time tRFC2, the host 10 may read the first error pattern ERROR PATTERN 1.

If the first error pattern ERROR PATTERN 1 is different from the first data DATA 1 stored in the buffer in the host 10, the host 10 may perform an error correction operation. As a result of the error correction operation of the host 10, the first data DATA 1 may be written at the address ADDR of the memory device 300.

The host 10 may provide the refresh command REF to the memory device 300 at a time point t4 after a refresh cycle tREFI elapses from the time point t1.

The memory device 300 may perform the refresh operation in response to the refresh command REF. The memory device 300 may perform the refresh operation for the first refresh time tRFC1.

The computing unit 200 may detect the refresh command REF provided from the host 10 to the memory device 300 at the time point t4.

The computing unit 200 may read the memory device 300 at a time point t5 after the first refresh time tRFC1 elapses from the time point t4 when the refresh command REF is detected. The computing unit 200 may read an address ADDR stored in the buffer in the computing unit 200. Since the first data DATA 1 is written at the address ADDR by the error correction operation of the host 10, the computing unit 200 may read the first data stored at the address ADDR of the memory device 300.

The computing unit 200 may compare the first data DATA 1 stored in the buffer 220 of the computing unit 200 with the first data read at the address ADDR of the memory device 300.

If the first data DATA 1 stored in the buffer in the computing unit 200 is still the same as the first data read at the address ADDR in the memory device 300, the computing unit 200 may determine the first error pattern ERROR PATTERN 1 as a correctable error pattern, and may store the error correction result in the error correction result storage in the computing unit 200.

If the first data DATA 1 stored in the buffer in the computing unit 200 is not still the same as the first data read at the address ADDR in the memory device 300, the computing unit 200 may determine the first error pattern ERROR PATTERN 1 as an uncorrectable error pattern, and may store the error correction result in the error correction result storage in the computing unit 200.

The host 10 may provide the refresh command REF to the memory device 300 at a time point t7 after the refresh cycle tREFI elapses from the time point t6.

The memory device 300 may perform the refresh operation in response to the refresh command REF. The memory device 300 may perform the refresh operation for the first refresh time tRFC1.

Further, the computing unit 200 may detect the refresh command REF provided from the host 10 to the memory device 300 at a time point t7 of FIG. 7.

At a time point t8 after the first refresh time tRFC1 elapses from the time point t7 when the refresh command REF is detected, the computing unit 200 may write a second error pattern ERROR PATTERN 2 from among a plurality of error patterns stored in the error pattern storage 230, at the addresses ADDR of the memory device 300. The address ADDR may be the address ADDR stored in the buffer of the computing unit 200.

The host 10 may read the memory device 300 at a time point t9 after the second refresh time tRFC2 elapses from the time point t7 when the refresh command REF is provided. The host 10 may read the address ADDR stored in the buffer 120 in the host 10. Since the computing unit 200 writes the second error pattern ERROR PATTERN 2 at the address ADDR in the memory device 300 for the second refresh time tRFC2, the host 10 may read the second error pattern ERROR PATTERN 2.

If the second error pattern ERROR PATTERN 2 is different from the first data DATA 1 stored in the buffer in the host 10, the host 10 may perform an error correction operation. As a result of the error correction operation of the host 10, the first data DATA 1 may be written at the address ADDR of the memory device 300.

The host 10 may provide the refresh command REF to the memory device 300 at a time point t10 after the refresh cycle tREFI elapses from the time point t7.

The memory device 300 may perform the refresh operation in response to the refresh command REF. The memory device 300 may perform the refresh operation for the first refresh time tRFC1.

The computing unit 200 may detect the refresh command REF provided from the host 10 to the memory device 300 at the time point t10.

The computing unit 200 may read the memory device 300 at a time point t11 after the first refresh time tRFC1 elapses from the time point t10 when the refresh command REF is detected. The computing unit 200 may read an address ADDR stored in a buffer in the computing unit 200. Since the first data DATA 1 is written at the address ADDR by the error correction operation of the host 10, the computing unit 200 may read the first data DATA 1 at the address ADDR of the memory device 300.

The computing unit 200 may compare the first data DATA 1 stored in the buffer in the computing unit 200 with the first data read at the address ADDR in the memory device 300.

If the first data DATA 1 stored in the buffer in the computing unit 200 is the same as the first data read at the address ADDR in the memory device 300, the computing unit 200 may determine the second error pattern ERROR PATTERN 2 as a correctable error pattern, and may store the error correction result in the error correction result storage in the computing unit 200.

If the first data DATA 1 stored in the buffer in the computing unit 200 is not the same as the first data read at the address ADDR in the memory device 300, the computing unit 200 may determine the second error pattern ERROR PATTERN 2 as an uncorrectable error pattern, and may store the error correction result in the error correction result storage in the computing unit 200.

The computing unit 200 repeats the aforementioned operation to determine the error correction result for all of the error patterns stored in the error pattern storage in the computing unit 200, and may store each error correction result in the error correction result storage in the computing unit 200. After that, the computing unit 200 may calculate the error correction coverage. Therefore, the memory system 1 according to an exemplary embodiment of the present disclosure may calculate accurate error correction coverages.

In related art, an error was injected into the memory device by causing a bit flip on a bus which connects the host and the memory device in accordance with a clock signal of the host. Therefore, it was affected by the operation of the host, and the injected error was limited to a unit of a bit.

However, the memory system 1 according to an exemplary embodiment of the present disclosure may write an error pattern at a particular address included in the error injection command CMD_E in response to the error injection command CMD_E. That is, an address in the memory device 300 for injecting an error may be set.

Since the memory system 1 according to an exemplary embodiment of the present disclosure detects the refresh command REF and performs the error injection operation, separate commands need not be implemented. Since the refresh command REF is provided to the computing unit 200 in accordance with the refresh cycle tREFI, the computing unit 200 may automatically perform the error injection operation on the entire error patterns stored in the error pattern storage. Therefore, the error can be injected into the memory device 300 regardless of the operation of the host 10.

Since the error injection operation may be performed on the entire error patterns stored in the error pattern storage, more accurate error correction coverage can be calculated.

Figure 8:
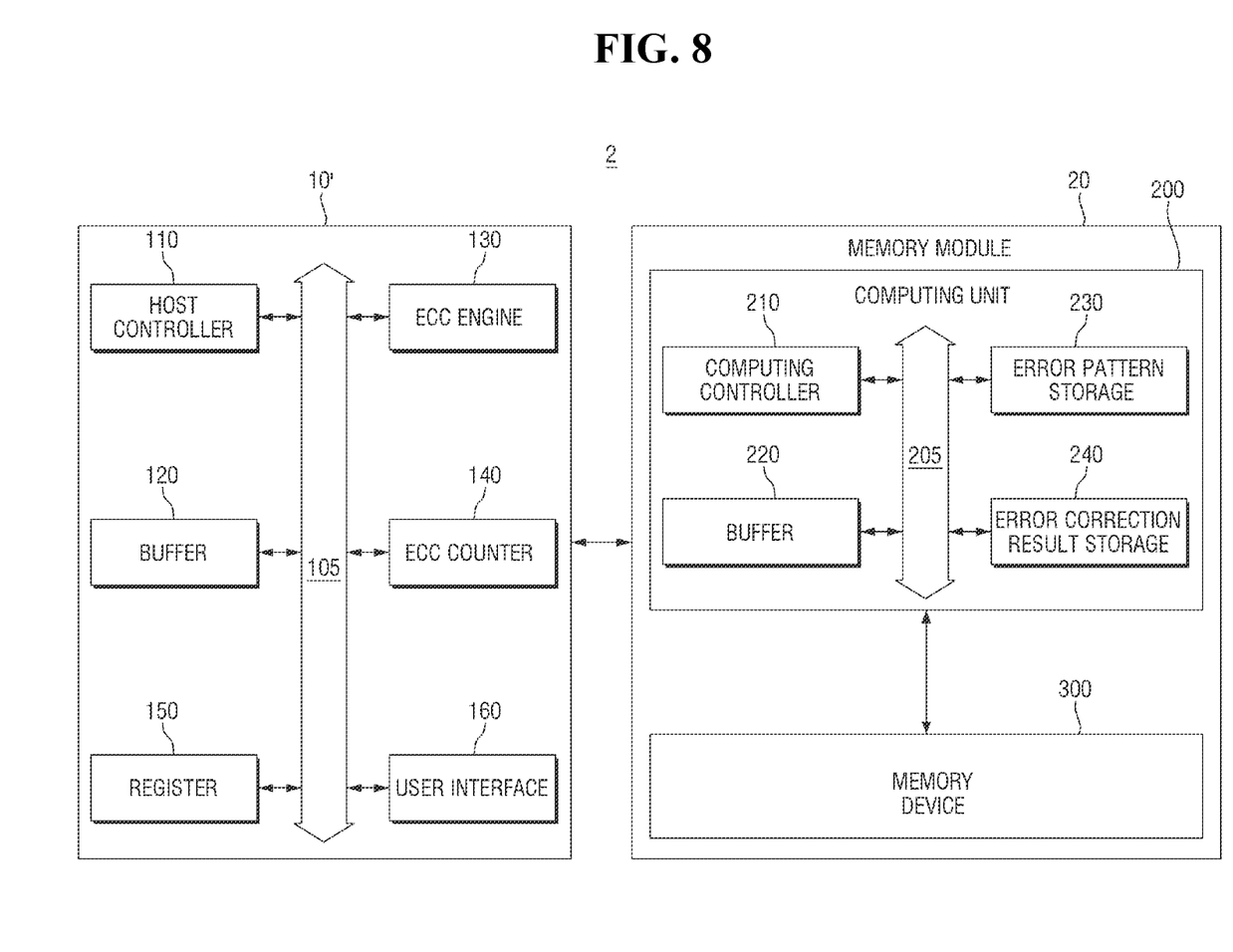
FIG. 8 is a block diagram of a memory system according to an exemplary embodiment.

FIG. 8 is a block diagram of a memory system according to an exemplary embodiment. Differences from FIG. 1 will be mainly described.

Referring to FIG. 8, in a memory system 2 according to an embodiment of the present disclosure, the host 10' may further include a user interface 160.

The user interface 160 may be configured to receive a user input signal. The user interface 160 may be, for example, one or more input elements such as a keyboard, a keypad, a touch panel, a touch screen, and/or a touch pad. Alternatively, the user interface 160 may include a display device and/or one or more output devices.

The host controller 110 may be provided with an address inside the memory device 300 into which the error is injected through the user interface 160. That is, the host controller 110 may provide the computing unit 200 with the address provided through the user interface 160, after the error injection operation of the computing unit 200 is started. Accordingly, the computing unit 200 can perform the error injection operation on the changed address.

The user interface 160 may also output the error correction operation result and/or the error correction coverage of the host 10'.

Figure 9:
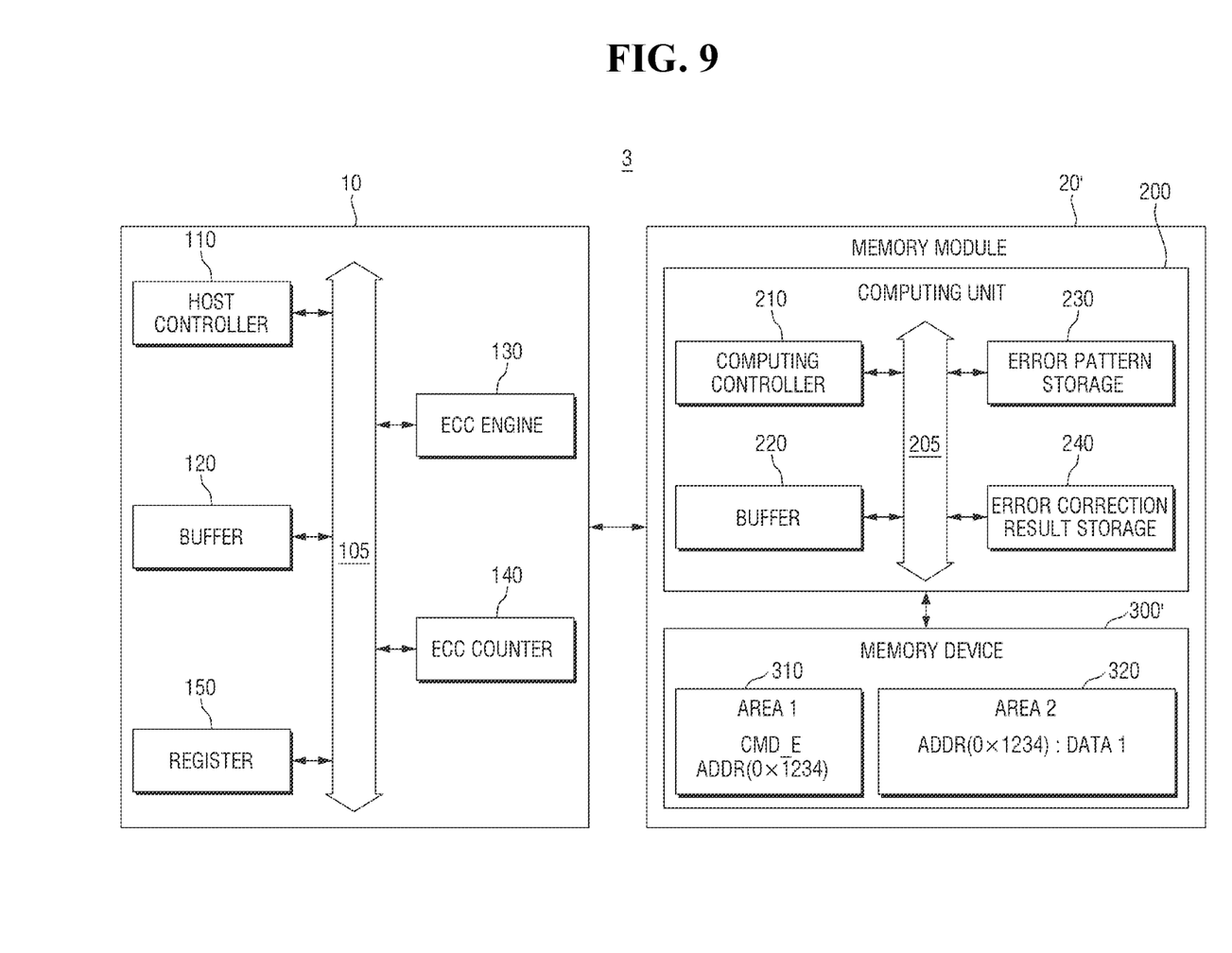
FIG. 9 is a block diagram for explaining a memory system according to an exemplary embodiment.

FIG. 9 is a block diagram for explaining a memory system according to an exemplary embodiment. Differences from FIG. 1 will be mainly described.

Referring to FIG. 9, in a memory system 20' according to an exemplary embodiment, a memory device 300' may include a first region 310 and a second region 320.

The first region 310 may be a region for the host 10 and the computing unit 200 to communicate with each other. The second region 320 may be a region in which data is stored. The host 10 and the computing unit 200 may store data in the second region 320 or read data from the second region 320.

The first region 310 may be a region in which are written the error injection command CMD_E provided from the host 10 and the address ADDR included in the error injection command CMD_E. The second region 320 may be a region in which data DATA 1 is stored at the address ADDR provided from the host 10.

The computing unit 200 detects the refresh command provided to the memory device 300', and may read the first region 310 at a time point after a certain time elapses from the time point when the refresh command is detected. Here, the certain time may be the first refresh time.

The computing unit 200 may read the first region 310 to receive an error injection command CMD_E and perform an error injection operation in response to the error injection command CMD_E. That is, the host 10 may provide the error injection command CMD_E to the computing unit 200 through the first region 310 of the memory device 300'.

Figure 10:
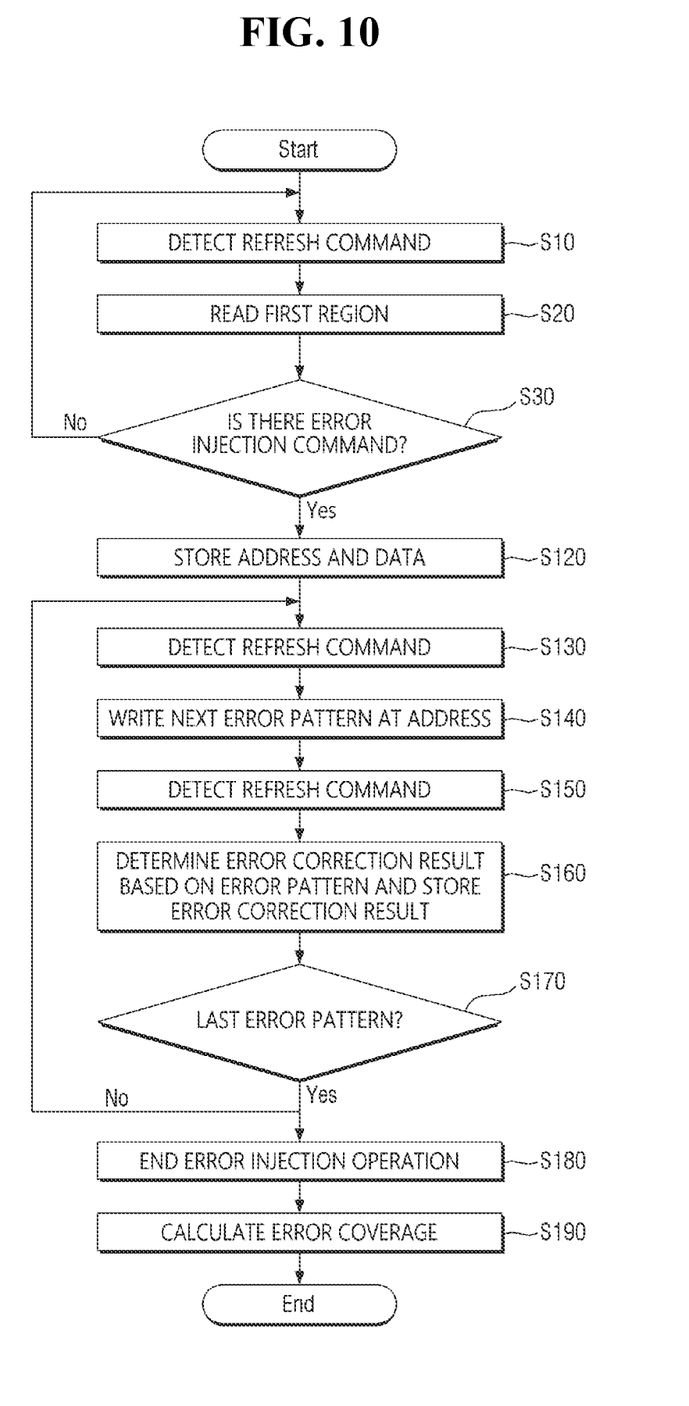
FIG. 10 is a flowchart diagram for explaining the operation of the memory module of FIG. 9.

FIG. 10 is a flowchart for explaining the operation of the memory module of FIG. 9. Differences from FIG. 3 will be mainly described.

Referring to FIGS. 9 and 10, the computing unit 200 may detect a refresh command provided from the host 10 to the memory device 300' at function block S10.

The computing unit 200 may read the first region 310 of the memory device 300' at the time point after a certain time elapses from the time point when the refresh command is detected at function block S20.

When the computing unit 200 reads the first region 310 and reads the error injection command CMD_E at decision block S30, the computing unit 200 may store the address ADDR and data DATA 1, which are included in the error injection command CMD_E, in the buffer 220 at function block S120.

When the computing unit 200 reads the first region 310 and does not read the error injection command CMD_E at decision block S30, the computing unit 200 returns to the block S10 and may detect the refresh command provided to the memory device 300' from the host 10.

Figure 11:
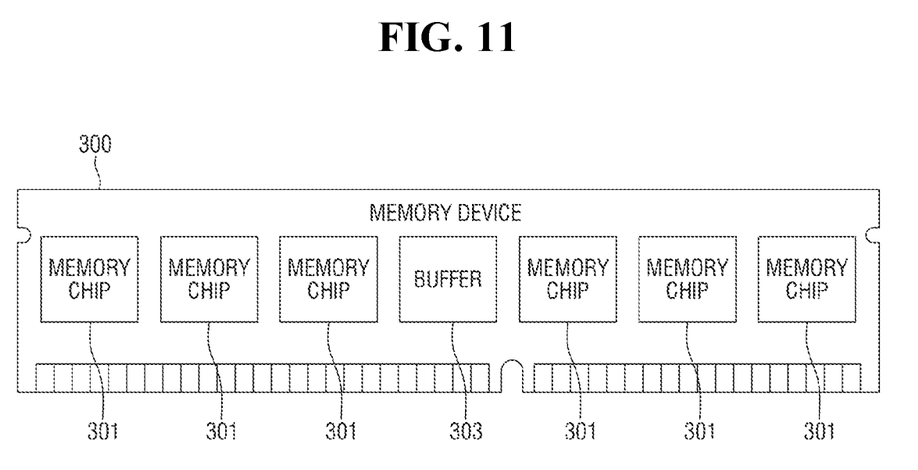
FIG. 11 is a layout diagram for explaining the memory device of FIG. 1.

FIG. 11 is a diagram for explaining the memory device of FIG. 1.

Referring to FIG. 11, the memory device 300 according to an embodiment of the present disclosure may have a structure of a Dual In-line Memory Module (DIMM) type, without limitation thereto. For example, the memory device 300 may have a structure of type, such as an Unbuffered Dual In-line Memory Module (UDIMM), a Registered Dual In-line Memory Module (RDIMM), a Fully Buffered Dual In-line Memory Module (FBDIMM), and/or a Load Reduced Dual In-line Memory Module (LRDIMM), without limitation thereto.

The memory device 300 may include a plurality of memory chips 301 and a buffer 303.

The buffer 303 may receive command, address, and data from the computing unit or host, buffer the command, address, and data, and provide them to the memory chips 301.

Data transmission lines between the buffer 303 and the memory chips 301 may be connected in a point-to-point manner. Command/address transmission lines between the buffer 303 and the memory chips 301 may be connected in a multi-drop manner, a daisy-chain manner or a fly-by-daisy-chain manner, without limitation thereto.

Because the buffer 303 may buffer all of the command, address and data, the computing unit or host may interface with the memory device 300 by driving only the load of the buffer 303.

While the present disclosure has been particularly shown and described with reference to exemplary embodiments thereof, it will be understood by those of ordinary skill in the pertinent art that various changes in form and detail may be made therein without departing from the spirit and scope of the present disclosure as defined by the following claims.

What is claimed is:

1. A memory module comprising:
   a memory device configured to receive a first refresh command from a host, and perform a refresh operation in response to the first refresh command during a refresh time; and
   a computing unit configured to detect the first refresh command provided from the host to the memory device, and write a first error pattern at a first address of the memory device during the refresh time.

2. The memory module of claim 1, wherein the refresh time is longer than a first refresh time, which is a minimum time for the memory device to perform the refresh operation.

3. The memory module of claim 1, wherein:
   the computing unit is configured to write the first error pattern at the first address of the memory device at a time point after a first refresh time elapses from a time point when the first refresh command is detected,
   the first refresh time is a minimum time for the memory device to perform the refresh operation, and
   the refresh time is longer than the first refresh time.

4. The memory module of claim 1, wherein the computing unit is configured to detect the first refresh command provided to the memory device from the host after being provided with an error injection command from the host, and write the first error pattern at the first address of the memory device during the refresh time.

5. The memory module of claim 4, wherein:
   the error injection command includes the first address and a first data,
   the memory device includes a first region in which the error injection command provided from the host is stored, and a second region which includes the first address, the first data being stored in the first address, and
   the computing unit is configured to read the first region during the refresh time and receive the error injection command from the host.

6. The memory module of claim 5, wherein:
   the computing unit further comprises a buffer configured to store the first data stored at the first address, and
   the computing unit is configured to write the first error pattern at the first address after storing the first data in the buffer.

7. The memory module of claim 6, wherein:
   the memory device is configured to receive a second refresh command from the host, and perform the refresh operation in response to the second refresh command during the refresh time, and
   the computing unit is configured to detect the second refresh command provided from the host to the memory device, read a second data stored at the first address for the refresh time, and determine an error correction result for the first error pattern based on the first data and the second data stored in the buffer.

8. The memory module of claim 7, wherein the computing unit is configured to determine the error correction result with the first error pattern as a correctable pattern when the first data and the second data are the same, and determine the error correction result with the first error pattern as an uncorrectable pattern when the first data and the second data are not the same.

9. The memory module of claim 7, wherein:
   the computing unit further comprises an error correction result storage configured to store the error correction result, and
   the computing unit is configured to calculate error correction coverage based on the error correction result stored in the error correction result storage.

10. The memory module of claim 1, wherein:
    the memory device is configured to receive a third refresh command from the host, and perform the refresh operation in response to the third refresh command for the refresh time, and the computing unit is configured to detect the third refresh command provided from the host to the memory device, and write a second error pattern different from the first error pattern at the first address during the refresh time.

11. The memory module of claim 1, wherein:
the memory device is configured to receive a third refresh command from the host, and perform the refresh operation for the refresh time in response to the third refresh command, and
the computing unit is configured to receive a second address, which is different from the first address, from the host, detect the third refresh command provided from the host to the memory device, and write a second error pattern different from the first error pattern at the second address during the refresh time.

12. The memory module of claim 1, wherein the memory device is configured to operate without receiving a valid command from the host during the refresh time.

13. A memory module comprising:
a memory device configured to receive a first refresh command from a host, and perform a refresh operation in response to the first refresh command;
a computing controller configured to detect the first refresh command provided to the memory device from the host, and read a first data stored at a first address of the memory device at a first time point after a preset time elapses from a first refresh time point when the first refresh command is detected;
a buffer in which the read first data is stored; and
error pattern storage in which a plurality of error patterns are stored,
wherein the computing controller is configured to read the first data stored at the first address of the memory device, and then write a first error pattern from among the plurality of error patterns at the first address.

14. The memory module of claim 13, wherein:
the memory device is configured to receive a second refresh command from the host, and perform the refresh operation in response to the second refresh command,
the computing controller is configured to detect the second refresh command provided from the host to the memory device, and read a second data stored at the first address at a second time point after the preset time elapses from a second refresh time point when the second refresh command is detected, and
the computing controller is configured to determine the first error pattern as a correctable pattern when the first data and the second data are the same, and determine the first error pattern as an uncorrectable pattern when the first data and the second data are not the same.

15. The memory module of claim 13, wherein the preset time is a minimum time for the memory device to perform the refresh operation.

16. The memory module of claim 13, wherein:
the memory device is configured to receive a third refresh command from the host, and perform the refresh operation in response to the third refresh command,
the computing controller is configured to detect the third refresh command provided from the host to the memory device, and write a second error pattern from among the plurality of error patterns at the first address of the memory device at a third time point after the preset time elapses from a third refresh time point when the third refresh command is detected, and
the second error pattern is different from the first error pattern.

17. The memory module of claim 13, wherein:
the memory device includes a first region in which the first address from the host is stored, and a second region including the first address, and
the computing controller is configured to read the first address stored in the first region at a time point after the preset time elapses from the first refresh time point when the first refresh command is detected.

18. A method for operating a memory module, the method comprising:
refreshing a memory device in response to a first refresh command during a refresh time;
storing in a buffer a first data stored at a first address of the memory device during the refresh time; and
writing a first error pattern at the first address of the memory device,
wherein the refresh time is longer than a first refresh time, which is a minimum time for the memory device to perform a refresh operation.

19. The method of claim 18, further comprising:
refreshing the memory device in response to a second refresh command different from the first refresh command during the refresh time;
reading a second data stored in the first address of the memory device during the refresh time; and
determining an error correction result for the first error pattern based on the first data stored in the buffer and the read second data.

20. The method of claim 19, wherein
when the first data stored in the buffer and the read second data are the same, the error correction result is determined with the first error pattern as a correctable pattern; and
when the first data stored in the buffer and the read second data are not the same, the error correction result is determined with the first error pattern as an uncorrectable pattern.

* * * * *